(12) United States Patent
Yao et al.

(10) Patent No.: US 8,736,030 B2
(45) Date of Patent: May 27, 2014

(54) QUAD FLAT NON-LEADED PACKAGE STRUCTURE WITH ELECTROMAGNETIC INTERFERENCE SHIELDING FUNCTION AND METHOD FOR FABRICATING THE SAME

(75) Inventors: Chin-Tsai Yao, Taichung (TW); Chien-Ping Huang, Taichung (TW); Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 279 days.

(21) Appl. No.: 12/769,024

(22) Filed: Apr. 28, 2010

(65) Prior Publication Data

US 2011/0198737 A1    Aug. 18, 2011

(30) Foreign Application Priority Data

Feb. 12, 2010    (TW) ................................ 99104606 A

(51) Int. Cl.
*H01L 23/552*    (2006.01)

(52) U.S. Cl.
USPC ............................ 257/659; 257/660; 438/106

(58) Field of Classification Search
USPC ............................ 257/200, 659, 660; 438/106
See application file for complete search history.

(56) References Cited

U.S. PATENT DOCUMENTS

| | | | |
|---|---|---|---|
| 4,218,578 A | 8/1980 | Olschewski et al. | |
| 4,838,475 A | 6/1989 | Mullins et al. | |
| 4,953,002 A | 8/1990 | Nelson et al. | |
| 5,030,935 A | 7/1991 | Williams et al. | |
| 5,166,772 A * | 11/1992 | Soldner et al. | 257/659 |
| 5,220,489 A | 6/1993 | Barreto et al. | |
| 5,311,059 A | 5/1994 | Banerji et al. | |
| 5,557,142 A | 9/1996 | Gilmore et al. | |
| 5,679,975 A * | 10/1997 | Wyland et al. | 257/659 |
| 7,030,469 B2 | 4/2006 | Mahadevan et al. | |
| 7,342,303 B1 | 3/2008 | Berry et al. | |
| 7,790,500 B2 * | 9/2010 | Ramos et al. | 438/106 |
| 8,022,511 B2 * | 9/2011 | Chiu et al. | 257/659 |
| 8,053,872 B1 * | 11/2011 | Swan et al. | 257/659 |
| 2002/0121650 A1 * | 9/2002 | Minamio et al. | 257/200 |
| 2009/0146269 A1 * | 6/2009 | Chow et al. | 257/659 |
| 2009/0194852 A1 * | 8/2009 | Chiu et al. | 257/660 |
| 2009/0256244 A1 * | 10/2009 | Liao et al. | 257/660 |
| 2011/0133316 A1 * | 6/2011 | Huang et al. | 257/659 |

* cited by examiner

*Primary Examiner* — Eugene Lee
*Assistant Examiner* — Fang-Xing Jiang
(74) *Attorney, Agent, or Firm* — Edwards Wildman Palmer LLP; Peter F. Corless; Steven M. Jensen

(57) ABSTRACT

A quad flat non-leaded (QFN) package structure with an electromagnetic interference (EMI) shielding function is proposed, including: a lead frame having a die pad, a plurality of supporting portions connecting to the die pad and a plurality of leads disposed around the periphery of the die pad without connecting to the die pad; a chip mounted on the die pad; bonding wires electrically connecting the chip and the leads; an encapsulant for encapsulating the chip, the bonding wires and the lead frame and exposing the side and bottom surfaces of the leads and the bottom surface of the die pad; and a shielding film disposed on the top and side surfaces of the encapsulant and electrically connecting to the supporting portions for shielding from EMI. A method of fabricating the package structure as described above is further proposed.

7 Claims, 4 Drawing Sheets

QUAD FLAT NON-LEADED PACKAGE STRUCTURE WITH ELECTROMAGNETIC INTERFERENCE SHIELDING FUNCTION AND METHOD FOR FABRICATING THE SAME

CROSS-REFERENCES TO RELATED APPLICATIONS

This application claims under 35 U.S.C. §119(a) the benefit of Taiwanese Application No. 099104606 filed Feb. 12, 2010 the entire contents of which is incorporated herein by reference.

BACKGROUND OF THE INVENTION

1. Field of the Invention

The present invention relates to package structures and methods for fabricating the same, and more particularly, to a quad flat non-leaded (QFN) package structure with an electromagnetic interference (EMI) shielding function and a method for fabricating the same.

2. Description of Related Art

Generally, a lead frame can be used as a chip carrier, which has a die pad and a plurality of leads formed around the periphery of the base. A chip can be mounted to the die pad and electrically connected to the leads through bonding wires. Further, an encapsulant can be formed to encapsulate the chip, the die pad, the bonding wires and the inner portions of the leads so as to form a semiconductor package with a lead frame.

In order to reduce package size, QFN package structures that dispense with outer leads protruding from the encapsulant are developed. However, such a package size can easily be influenced by external EMI noises during operation, thus adversely affecting electrical performance of the overall package structure.

Accordingly, U.S. Pat. No. 5,166,772 discloses a structure with a metal shield embedded in the encapsulant thereof.

FIG. 1 is a cutaway perspective view of the structure disclosed in U.S. Pat. No. 5,166,772. Referring to FIG. 1, a chip 11 is mounted on a substrate 10 and electrically connected to the substrate 10 through a plurality of bonding wires 12, wherein the substrate 10 has at least a ground terminal 14, and a perforated metal shield 13 is disposed to cover the chip 11 and electrically connected to the ground terminal 14. An encapsulant 15 is formed to cover the metal shield 13, the chip 11, the bonding wires 12 and a portion of the substrate 10, thereby embedding the metal shield 13 in the encapsulant 15. The metal shield 13 shields the chip 11 from external EMI so as to improve electrical performance of the overall structure. Similar structures are also disclosed in U.S. Pat. No. 4,218,578, No. 4,838,475, No. 4,953,002 and No. 5,030,935.

However, since an additionally fabricated metal shield 13 is required in the above-described structure, the fabrication process of the structure is complicated. Further, the metal shield 13 is required to cover the chip 11 and fixed to the substrate 10, thus increasing the assembly difficulty. Furthermore, after the metal shield 13 is disposed on the substrate 10 to cover the chip 11, the encapsulant 15 must pass through the metal shield 13 in order to encapsulate the chip 11. Since the metal shield 13 is perforated, when the encapsulant 15 passes through the metal shield 13, turbulence can easily occur in the encapsulant 15, thus resulting in generation of air bubbles in the encapsulant 15 and causing a popcorn effect in a subsequent thermal processing.

FIG. 2 is a cutaway perspective view of a structure disclosed by U.S. Pat. No. 5,557,142. Referring to FIG. 2, a chip 21 is mounted on a substrate 20 and electrically connected to the substrate 20 through a plurality of bonding wires 22. Further, an encapsulant 23 is formed to encapsulate the chip 21, the bonding wires 22 and a portion of the substrate 20, and a metal layer 24 is formed on the exposed surface of the encapsulant 23 through coating or sputtering so as to shield the package structure from EMI. Similar structures are also disclosed in U.S. Pat. No. 5,220,489, No. 5,311,059 and No. 7,342,303.

The above structures dispense with complicated processes. However, since the metal layer 24 must be formed after a singulation process and it is difficult to perform component arrangement and pickup in a singulated package structure, the above structures are not suitable for mass production. In addition, the sputtering process cannot be applied in a package structure in which the encapsulant is flush with the substrate.

In a package structure disclosed by U.S. Pat. No. 7,030,469, a groove is formed on an encapsulant to expose bonding wires, and a conductive wire layer is formed in the groove and on the encapsulant to electrically connect to the bonding wires, thereby achieving a shielding effect. However, the conductive wire layer is made of a non-ferrous metal material and can only be formed on the groove and encapsulant by depositing or sputtering. Therefore, it cannot be applied in a package structure in which the encapsulant is flush with the substrate. Further, the contact between the conductive wire layer and the bonding wires is point contact, which can easily result in poor electrical connection between the conductive wire layer and the bonding wires.

Therefore, it is imperative to overcome the above drawbacks of the prior art.

SUMMARY OF THE INVENTION

In view of the above drawbacks of the prior art, the present invention provides a quad flat non-leaded (QFN) package structure with an electromagnetic interference (EMI) shielding function, which comprises: a lead frame having a die pad, a plurality of supporting portions connecting to the die pad and a plurality of leads disposed around the periphery of the die pad without connecting to the die pad; a chip mounted on the die pad; a plurality of bonding wires electrically connecting to the chip and the leads; an encapsulant for encapsulating the chip, the bonding wires and the lead frame in a manner that the side and bottom surfaces of the leads and the bottom surface of the die pad are exposed from the encapsulant; and a shielding film disposed on the top and side surfaces of the encapsulant and electrically connecting to the supporting portions.

The present invention further provides a fabrication method of a QFN package structure with an EMI shielding function, which comprises: providing a metal frame with a plurality of lead frames and a plurality of transverse and longitudinal connection strips, wherein each of the lead frames has a die pad, a plurality of supporting portions connecting to the die pad and a plurality of leads disposed around the periphery of the die pad without connecting to the die pad, the lead frames being connected to the connections trips through the supporting portions and the leads thereof; mounting a chip to the die pad of each of the lead frames and electrically connecting the chip to the corresponding leads through bonding wires; forming an encapsulant to encapsulate the connection strips, the chips, the bonding wires, the die pads, the leads and the supporting portions while exposing the bottom surfaces of the connection strips, the die pads and the leads from the encapsulant; performing a first cutting process for cutting the encapsulant along the connection strips so as to form in the encapsulant a plurality of grooves which exposes the connection strips and a portion of the supporting portions; forming a shielding film on the surface and in the grooves of the encapsulant and electrically connecting to the supporting portions; and performing a second cutting process for cutting the shielding film and the metal frame along the grooves and the connection strips such that the shielding film encloses the side surfaces of the encapsulant and is flush with the leads and the supporting portions.

Therein, the shielding film can be applied on the exposed surface of the encapsulant and in the grooves by screen printing and then cured. In another embodiment, the shielding film can be formed by dropping a liquid state carbon-based material or a metal powder-containing material into the grooves so as to form a first shielding film; forming a second shielding film on the exposed surface of the encapsulant and on the first shielding film in the grooves by screen printing; and curing the first shielding film and the second shielding film.

According to the present invention, the grooves are formed in the encapuslant before a singulation process so as to allow the EMI shielding film to be formed therein and in contact with the connection strips, thus achieving an EMI shielding function and facilitating mass production.

Further, the present invention overcomes the conventional drawback of turbulence which occurs when the encapsulant passes through a perforated metal shield, thus avoiding generation of air bubbles in the encapsulant and the popcorn effect caused thereby. Furthermore, since the shielding film and the supporting portions are in surface contact, it ensures higher electrical connection quality compared with the point contact of the prior art.

BRIEF DESCRIPTION OF DRAWINGS

FIG. 3A' is a cross-sectional view taken along a line A-A in FIG. 3A;

FIGS. 3D-1 and 3D-2 show another embodiment of the method as depicted in FIG. 3D.

DETAILED DESCRIPTION OF PREFERRED EMBODIMENTS

The following illustrative embodiments are provided to illustrate the disclosure of the present invention, these and other advantages and effects can be apparent to those in the art after reading this specification.

Figure 3A:
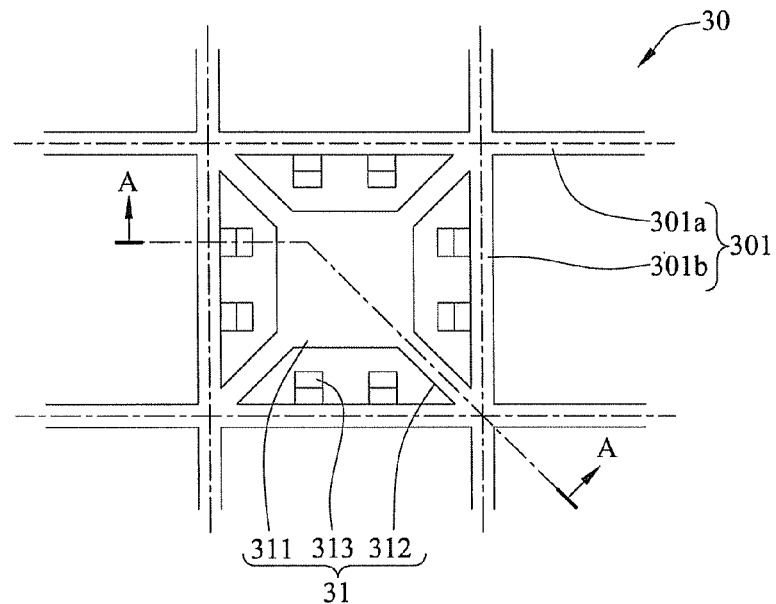
FIG. 3A is a top view regarding a fabrication method of a QFN package structure with an EMI shielding function according to the present invention.
Figure 3A:
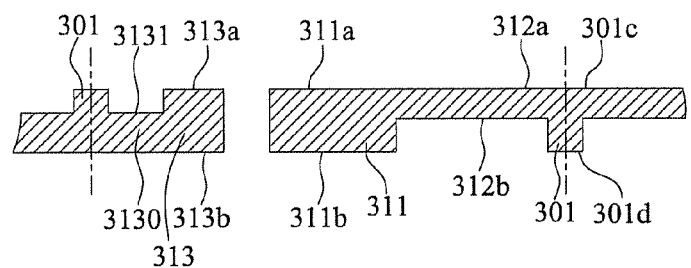

Please refer to FIGS. 3A, 3A', 3B, 3C, 3D, and 3E for the drawings of a fabrication method of a QFN package structure with an EMI shielding function according to the present invention. FIG. 3A is a top view. FIG. 3A' is a cross-sectional view taken along a line A-A in FIG. 3A. FIGS. 3B, 3C, 3D, and 3E are cross-sectional views.

Referring to FIGS. 3A and 3A', a metal frame 30 made of copper is provided, which comprises a plurality of lead frames 31 and a plurality of connection strips 301 composed of a plurality of transverse connection strips 301a and a plurality of longitudinal connection strips 301b. Each of the lead frames 31 has a die pad 311, a plurality of supporting portions 312 connecting to the die pad 311, and a plurality of leads 313 disposed at the periphery of the die pad 311 and separated from the die pad 311 by a predetermined distance. The supporting portions 312 and the leads 313 connect to the connection strips 301.

Each of the leads 313 has a top surface 313a and an opposing bottom surface 313b. The leads 313 each have an extending portion 3130 with a thickness less than the leads 313 such that the top surfaces 3131 of the extending portions 3130 and the top surfaces 313a of the leads 313 together form a stepped structure. Generally, the top surfaces 3131 of the extending portions 3130 or the stepped structure can be formed by etching away a portion of the extending portions 3130 such that the extending portion 3130 is of a thickness less than the leads 313.

In particular, as shown in FIG. 3A, the supporting portions 312 of each of the lead frames 31 extend from the die pad 311 to intersection points of the transverse connection strips 301a and the longitudinal connection strips 301b. The leads 313 are connected to the connection strips 301 through the extending portions 3130 thereof without connecting to the die pad 311. Further, the thickness of the supporting portions 312 is less than the thickness of the die pad 311. The bottom surfaces 312b of the supporting portions 312, the bottom surface 311b of the die pad 311, and the bottom surfaces 301d of the connection strips 301 together form a stepped structure. Alternatively, the top surfaces 312a of the supporting portions 312 are not flush with the top surface 311a of the die pad 311 and the top surfaces 301c of the connection strips 301 to thereby form a stepped structure therefrom such that the thickness of the supporting portions 312 is less than the thickness of the die pad 311. The stepped structure can be formed by etching.

Figure 3B:
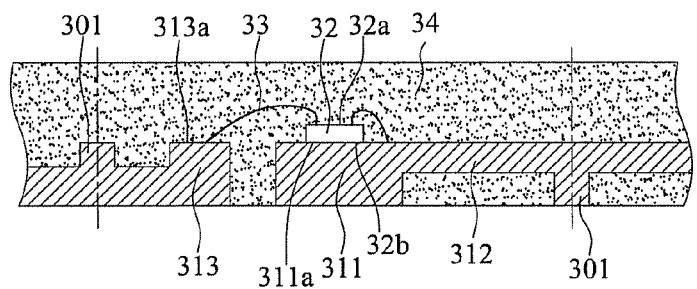
FIGS. 3B, 3C, 3D, and 3E are cross-sectional views showing the fabrication method of a QFN package structure with an EMI shielding function according to the present invention.

Referring to FIG. 3B, a chip 32 is mounted on the top surface 311a of the die pad 311 of each of the lead frames 31 and electrically connected to the top surfaces 313a of the leads 313 and the top surface 311a of the die pad 311 through a plurality of bonding wires 33, wherein the die pad 311 is electrically grounded. Then, an encapsulant 34 is formed to encapsulate the connection strips 301, the chips 32, the bonding wires 33, the die pads 311, the leads 313 and the supporting portions 312, in a manner that the bottom surfaces 301d, 311b, 313b of the connections strips 301, the die pads 311, and the leads 313 are exposed from the encapsulant 34.

Figure 3C:
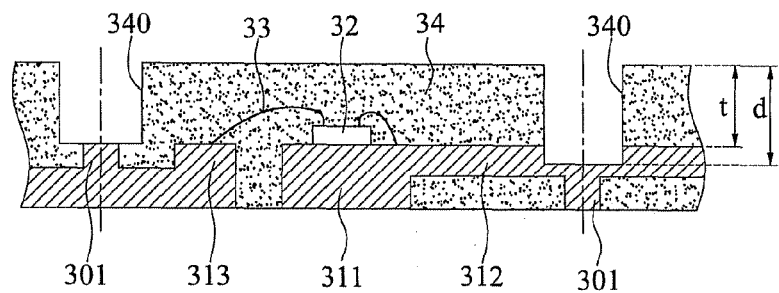

Referring to FIG. 3C, a first cutting process is performed for cutting the encapsulant 34 along the center line of each of the connection strips 301 so as to form a plurality of grooves 340 for exposing the connection strips 301 and a portion of the supporting portions 312. The cutting depth d for the first cutting process is greater than or equal to the thickness t of the encapsulant 34. To be specific, the connection strips 301 and a portion of the supporting portions 312 are exposed from the grooves 340 formed at the connection positions of the connection strips 301 and the supporting portions 312, that is, the cutting depth d at these positions is greater than the thickness t of the encapsulant 34 so as to facilitate electrical connection between a shielding film to be formed later and the supporting portions 312. Meanwhile, the cutting depth d at other positions is less than the thickness t of the encapsulant 34 for only exposing the connection strips 301. Further, the width of the grooves 340 is greater than that of the connection strips 301.

Figure 3D:
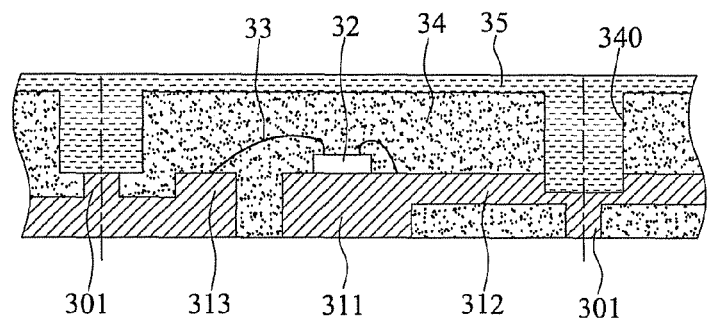
Figures 1, 3D:
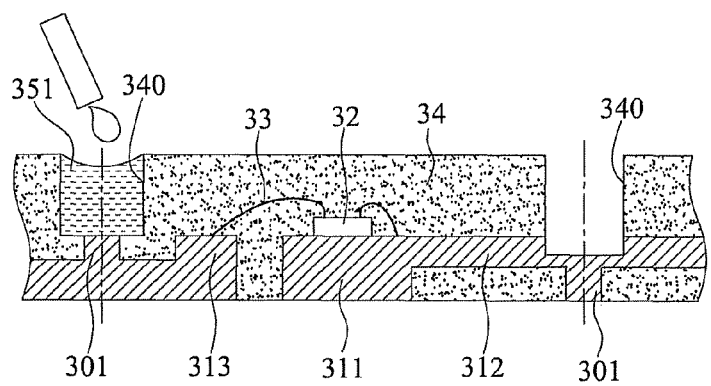
Figures 2, 3D:
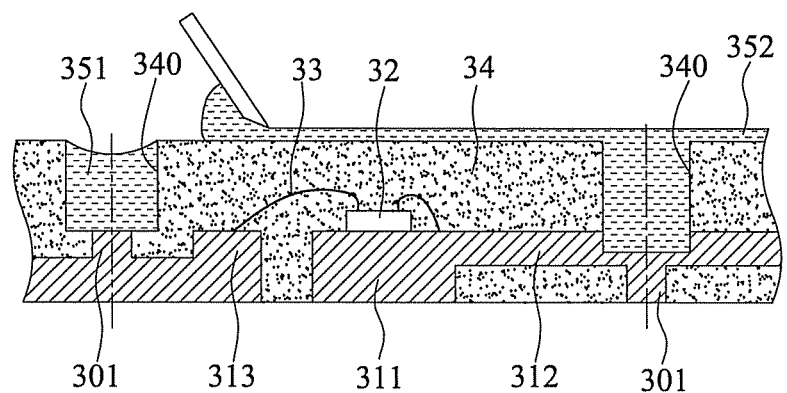

Referring to FIG. 3D, a shielding film 35 is formed on the surface of the encapsulant 34 and in the grooves 340 by screen printing and is made of a carbon-based material or a metal powder-containing material. The shielding film 35 is electrically connected to the supporting portions 312 and is cured after the screen printing process so as to shield the chips 32 from external EMI, thereby ensuring normal operation of the chips 32.

Figure 1:
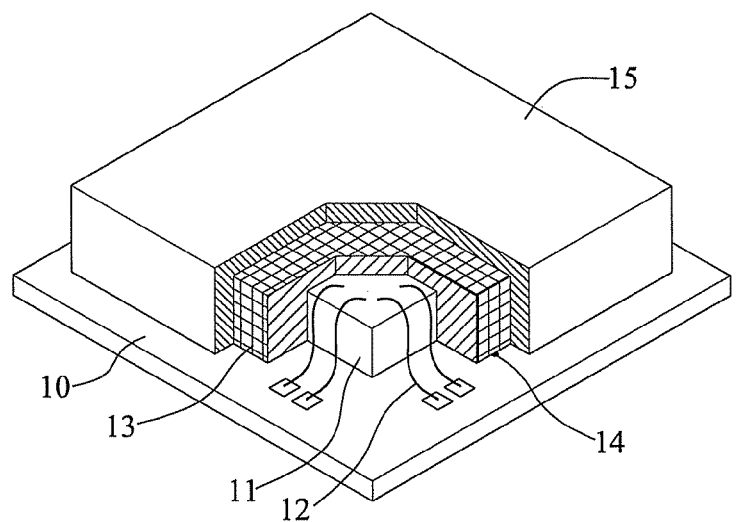
FIG. 1 is a cutaway perspective view of a package structure disclosed by U.S. Pat. No. 5,166,772.
Figure 2:
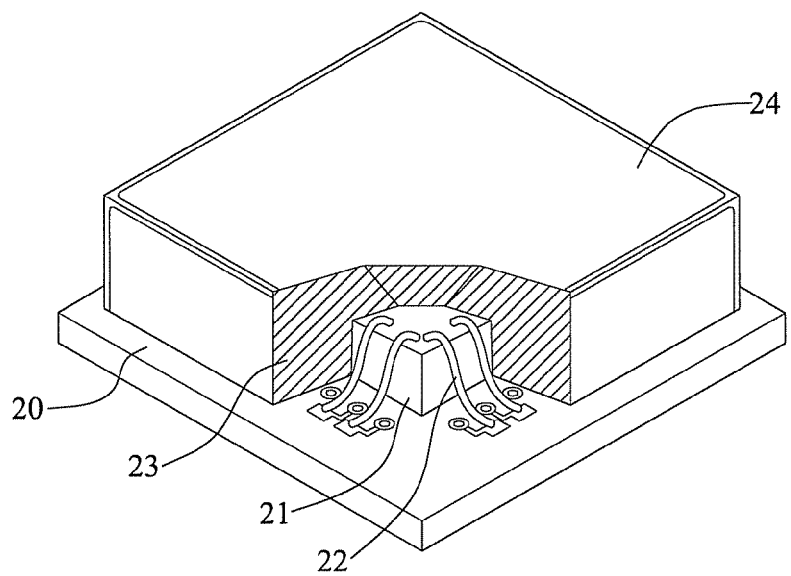
FIG. 2 is a cutaway perspective view of a package structure disclosed by U.S. Pat. No. 5,557,142.

FIGS. 3D-1 and 3D-2 show another embodiment of the method for forming the shielding film 35. Different from the previous embodiment, the present embodiment first drops a liquid state carbon-based material or metal power-containing material into the grooves 340 to form a first shielding film 351, as shown in FIG. 3D-1, and then forms a second shielding material 352 on the exposed surface of the encapsulant 34 and on the first shielding film 351, as shown in FIG. 3D-2, and finally cures the first shielding film 351 and the second shielding film 352 so as to from a shielding film 35.

Figure 3E:
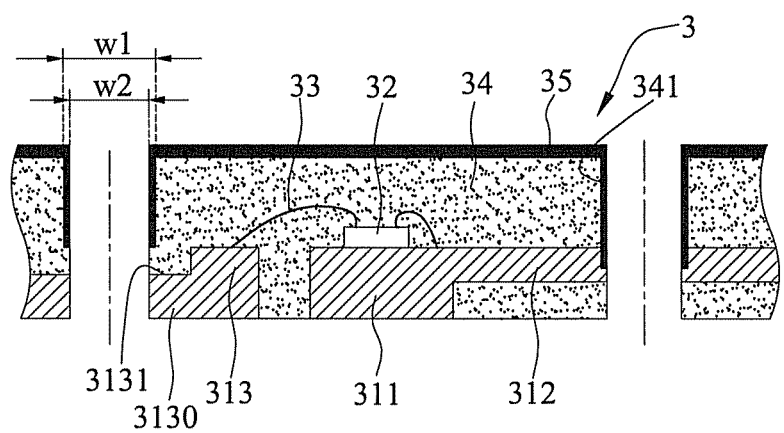

Referring to FIG. 3E, a second cutting process is performed for cutting the shielding film 35 and the metal frame 30 along the center lines of the connection strips 301 in the grooves 340, wherein the cutting width w2 for the second cutting process is less than the width w1 for the first cutting process such that the shielding film 35 encloses the sides 341 of the encapsulant 34 and is flush with the side surfaces of the leads 313 and the supporting portions 312.

According to the above fabrication method, the present invention further provides a QFN package structure 3 with an EMI shielding function, which comprises: a lead frame 31 having a die pad 311, a plurality of supporting portions 312 connecting to the die pad 311 and a plurality of leads 313 disposed at the periphery of the die pad 311 and separated from the die pad 311 by a predetermined distance; a chip 32 mounted on the die pad 311 and electrically connected to the top surfaces 313a of the leads 313 and the top surface 311a of the die pad 311 through a plurality of bonding wires 33; an encapsulant 34 for encapsulating the chip 32, the bonding wires 33 and the lead frame 31 while exposing the side and bottom surfaces 313b of the leads 313 and the bottom surface 311b of the die pad 311; and a shielding film 35 disposed on the top and side surfaces of the encapsulant 34 and electrically connected to the supporting portions 312. Therein, the shielding film 35 is made of a carbon-based material or a metal powder-containing material.

In the above structure, the encapsulant 34 separates the shielding film 35 from the leads 313, and the package structure 3 has even side surfaces. In particular, the leads 313 each have an extending portion 3130 extending towards the corresponding sides of the package structure 3. The extending portion 3130 is of a lesser thickness than the leads 313 such that the top surfaces 3131 of the extending portions 3130 and the top surfaces 313a of the leads 313 together form a stepped structure that is embedded in the encapsulant 34.

Further, the thickness of the supporting portions 312 is less than the thickness of the die pad 311. For example, the bottom surfaces 312b of the supporting portions 312 and the bottom surface 311b of the die pad 311 together form a stepped structure, thereby embedding the supporting portions 312 in the encapsulant 34. Furthermore, the package structure 3 has even side surfaces, and the shielding film 35 electrically connects to the supporting portions 312. The shielding film 35 can cover the ends of the supporting portions 312. Alternatively, as shown in FIG. 3E, the ends of the supporting portions 312 are partially exposed from the side surfaces of the package structure 3.

According to the present invention, a chip is mounted on the die pad of each of the lead frames of a metal frame and electrically connected to the corresponding leads and the die pad through bonding wires; then, an encapsulant is formed on the metal frame, the chips and the bonding wires; thereafter, a first cutting process is performed for cutting the encapuslant along the connection strips of the metal frame such that a plurality of grooves is formed in the encapsulant for exposing a portion of the supporting portions of the lead frames; then, a shielding film is formed on the exposed surface of the encapsulant and in the grooves and electrically connects to the supporting portions; thereafter, a second cutting process is performed for cutting the shielding film and the metal frame along the grooves such that shielding film encloses the sides of the encapsulant and the structure is singulated into a plurality of package units. As such, the present invention achieves an EMI shielding function through the shielding film and meanwhile facilitates mass production.

Further, the present invention overcomes the conventional drawback of turbulence which occurs when the encapsulant passes through a perforated metal shield, thus avoiding generation of air bubbles in the encapsulant and the popcorn effect caused thereby. Furthermore, since the shielding film and the supporting portions are in surface contact, it ensures higher electrical connection quality compared with the point contact of the prior art.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A quad flat non-leaded (QFN) package structure with an electromagnetic interference (EMI) shielding function, comprising:
    a lead frame having a die pad, a plurality of supporting portions connecting to the die pad, and a plurality of leads disposed at a periphery of the die pad and separated from the die pad by a predetermined distance, wherein each supporting portion has a step portion on a top surface of the supporting portion;
    a chip mounted on the die pad;
    a plurality of bonding wires electrically connecting to the chip and the leads;
    an encapsulant for encapsulating the chip, the bonding wires and the lead frame but exposing side and bottom surfaces of the leads and a bottom surface of the die pad, wherein the step portion is embedded in the encapsulant, and a bottom surface of each lead is exposed from the encapsulant; and
    a shielding film disposed on top and side surfaces of the encapsulant and electrically connected to the supporting portions, wherein the shielding film contacts a portion of a side surface of the supporting portion, and a rest portion of the side surface of the supporting portion is exposed.

2. The structure of claim 1, wherein the leads and the shielding film are separated from each other by the encapsulant.

3. The structure of claim 1, further having even side surfaces.

4. The structure of claim 1, wherein the supporting portions are of a thickness less than the die pad.

5. The structure of claim 1, wherein bottom surfaces of the supporting portions and the bottom surface of the die pad together form a stepped structure, and the supporting portions are embedded in the encapsulant.

6. The structure of claim 1, wherein ends of the supporting portions are exposed from side surfaces of the package structure.

7. The structure of claim 1, wherein the shielding film is made of a carbon-based material or a metal powder-containing material.

* * * * *